(12) United States Patent
Brown et al.

(10) Patent No.: US 9,078,371 B2
(45) Date of Patent: Jul. 7, 2015

(54) RADIOFREQUENCY ABSORPTIVE FILTER

(71) Applicant: Raytheon Company, Waltham, MA (US)

(72) Inventors: Andrew K. Brown, Rancho Cucamonga, CA (US); Thomas L. Obert, Rancho Cucamonga, CA (US); Michael J. Sotelo, Rancho Cucamonga, CA (US); Darin M. Gritters, Rancho Cucamonga, CA (US); Kenneth W. Brown, Rancho Cucamonga, CA (US)

(73) Assignee: RAYTHEON COMPANY, Waltham, MA (US)

( * ) Notice: Subject to any disclaimer, the term of this patent is extended or adjusted under 35 U.S.C. 154(b) by 187 days.

(21) Appl. No.: 13/651,789

(22) Filed: Oct. 15, 2012

(65) Prior Publication Data

US 2014/0102774 A1    Apr. 17, 2014

(51) Int. Cl.
*H05K 1/16* (2006.01)
*H05K 3/06* (2006.01)
*H05K 1/02* (2006.01)

(52) U.S. Cl.
CPC ............... *H05K 1/167* (2013.01); *H05K 3/06* (2013.01); *H05K 1/0234* (2013.01); *H05K 1/0242* (2013.01); *H05K 2201/0379* (2013.01); *H05K 2201/09263* (2013.01); *H05K 2201/09727* (2013.01); *H05K 2201/09781* (2013.01)

(58) Field of Classification Search
CPC .................................. H05K 1/167; H05K 3/06
See application file for complete search history.

(56) References Cited

U.S. PATENT DOCUMENTS

| | | | |
|---|---|---|---|
| 4,777,718 A | 10/1988 | Henderson et al. | |
| 5,039,961 A | 8/1991 | Veteran | |
| 6,225,570 B1 * | 5/2001 | Ishiyama et al. | 174/260 |
| 6,278,186 B1 | 8/2001 | Lowther et al. | |
| 7,088,204 B2 | 8/2006 | Kanno | |
| 7,288,723 B2 * | 10/2007 | Welbon et al. | 174/255 |
| 7,701,404 B2 | 4/2010 | McKivergan | |
| 8,222,968 B2 | 7/2012 | Takagi | |
| 2005/0260338 A1 * | 11/2005 | Chien | 427/96.1 |
| 2006/0046202 A1 * | 3/2006 | Kukanskis et al. | 430/315 |

FOREIGN PATENT DOCUMENTS

JP     WO99/18656    *  4/1999    ............... H02P 9/30

OTHER PUBLICATIONS

Machine translation of WO/18656, Apr. 1999.*
International Search Report; International Application No. PCT/US2013/054069; International Filing Date: Aug. 8, 2013; Date of Mailing: Jan. 29, 2014; 8 pages.

* cited by examiner

*Primary Examiner* — Jeremy C Norris
(74) *Attorney, Agent, or Firm* — Cantor Colburn LLP

(57) ABSTRACT

An apparatus for conveying an electrical signal includes: a conductive pathway having a conductive material. The conductive material has a first edge and a second edge and is configured to convey the electrical signal. The apparatus also includes a resistive material in contact with at least a portion of the conductive pathway, covering an edge of the conductive pathway, and extending beyond the edge. The resistive material has a conductivity less than the conductivity of the conductive material.

17 Claims, 6 Drawing Sheets

RADIOFREQUENCY ABSORPTIVE FILTER

BACKGROUND

The present disclosure relates generally to a filter configured to absorb radiofrequency (RF) emissions and microwave emissions in particular.

Printed circuit boards are structures used to mechanically support and electrically connect electronic components using conductive pathways, tracks, or signal traces etched from sheets of a conductive material laminated onto a non-conductive substrate. There are certain situations where a circuit board may be required to conduct different types of electrical signals such as microwave or millimeter-wave signals in addition to direct current (DC) or longer wave length signals. Unfortunately, in these situations, the shorter wavelength signals can emit radio-frequency radiation that interferes with the DC or longer wavelength signals rendering operation of the circuit board as problematic. Hence, it would be appreciated in the electronics industry if new circuit board techniques were developed that would limit or eliminate interference from microwave signals that affect other signals.

SUMMARY

Disclosed is an apparatus for conveying an electrical signal. The apparatus includes: a conductive pathway having a conductive material that has a first edge and a second edge and is configured to convey the electrical signal; and a resistive material in contact with at least a portion of the conductive pathway, covering an edge of the conductive pathway, and extending beyond the edge. The resistive material has a conductivity less than the conductivity of the conductive material.

Also disclosed is a method for conveying an electrical signal. The method includes: applying the electrical signal to a conductive pathway having a conductive material that has a first edge and a second edge, and is configured to convey the electrical signal; and absorbing radio-frequency radiation using a resistive material contacting at least a portion of the conductive pathway, covering an edge of the conductive pathway, and extending beyond the edge, the resistive material having a conductivity less than the conductivity of the conductive material.

Further disclosed is a method for fabricating an apparatus for conveying an electrical signal. The method includes: etching a conductive material layer to form a conductive pathway configured to convey the electrical signal, the conductive pathway having a first edge and a second edge; and etching a resistive material layer to form a desired shape of a resistive material contacting at least a portion of the conductive pathway, covering an edge of the conductive pathway, and extending beyond the edge, the resistive material having a conductivity less than the conductivity of the conductive material.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

A detailed description of one or more embodiments of the disclosed apparatus and method is presented herein by way of exemplification and not limitation with reference to the Figures.

Figure 1:
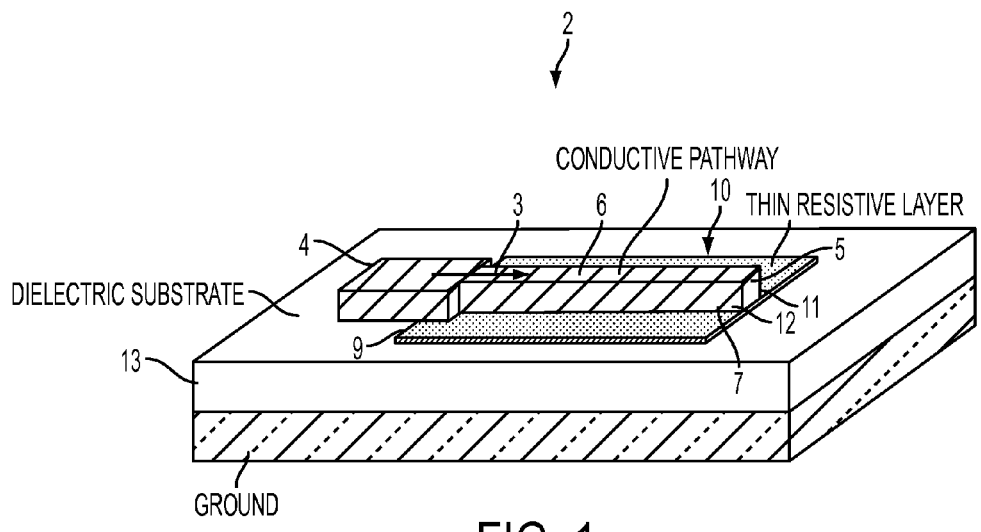
FIG. 1 is an exemplary embodiment of a circuit board having a pathway of a conductive material and an absorptive filter having a resistive material in contact with and overlapping the edges of the pathway.

Reference may now be had to FIG. 1, which presents a three-dimensional view of an exemplary embodiment of a circuit board 2 that is configured to transmit or convey an electrical signal 3 from a first point 4 to a second point 5. The electrical signal is conveyed through a pathway 6 of a conductive material 7. In one or more embodiments, the electrical signal 3 includes a radio-frequency (RF) signal, such as a microwave signal, that can emit RF radiation when the signal is conveyed and a direct-current (DC) or low-frequency signal. The term "microwave signal" relates to a signal having a wavelength in a range extending from about one (1) millimeter (mm) to about one (1) meter (mm), which is equivalent to a frequency of about 0.3 GHz to about 300 GHz, however, the disclosure herein may also relate to signals extending beyond this range. An absorptive filter 10 is disposed on the circuit board 2. The absorptive filter 10 is configured to absorb the RF radiation emitted while the RF signal is being transmitted. To absorb the RF radiation, the absorptive filter 10 includes a resistive material 9 that is in contact with the pathway 6 of the conductive material 7 and overlaps (i.e., covers and extends beyond) the two edges or sides (i.e., first edge 11 and second edge 12) of the pathway 6 as the pathway 6 extends from the first point 4 to the second point 5. As the RF signal travels along the pathway 6, the magnitude of the current density is highest along the outside edges of the pathway 6, which contrasts with the DC signal current that is distributed evenly throughout the pathway 6. By having the outside edges overlapped with the resistive material 9, the RF radiation is attenuated by being absorbed by the resistive material 9. That is, the RF radiation induces currents in the resistive material 9 and the energy of the currents is dissipated as heat by the resistance of the resistive material 9. Thus, the DC or low frequency signal that travels along the same pathway 6 is not affected by the RF radiation. In the embodiment of FIG. 1, the resistive material 9 is disposed on a dielectric substrate 13 with the conductive material 7 being disposed on the resistive material 9.

The conductive material 7 that conveys the electrical signal 3 is a highly conductive (i.e., low loss) metal such as copper, silver or gold as non-limiting embodiments. The resistive material 9, which dissipates RF induced currents as heat due to the resistivity of the resistive material 9, has a conductivity that is less than the conductivity of the conductive material 9 (or resistivity that is greater than the resistivity of the conductive material 7). In one or more embodiments, the resistive material 9 is fabricated to have a desired shape for use in the absorptive filter 10 from a resistive layer or sheet such as a resistive metal having a predetermined sheet resistivity in a range of 25 to 100 ohms per square ($\Omega/\square$) as a non-limiting embodiment.

Figure 2:
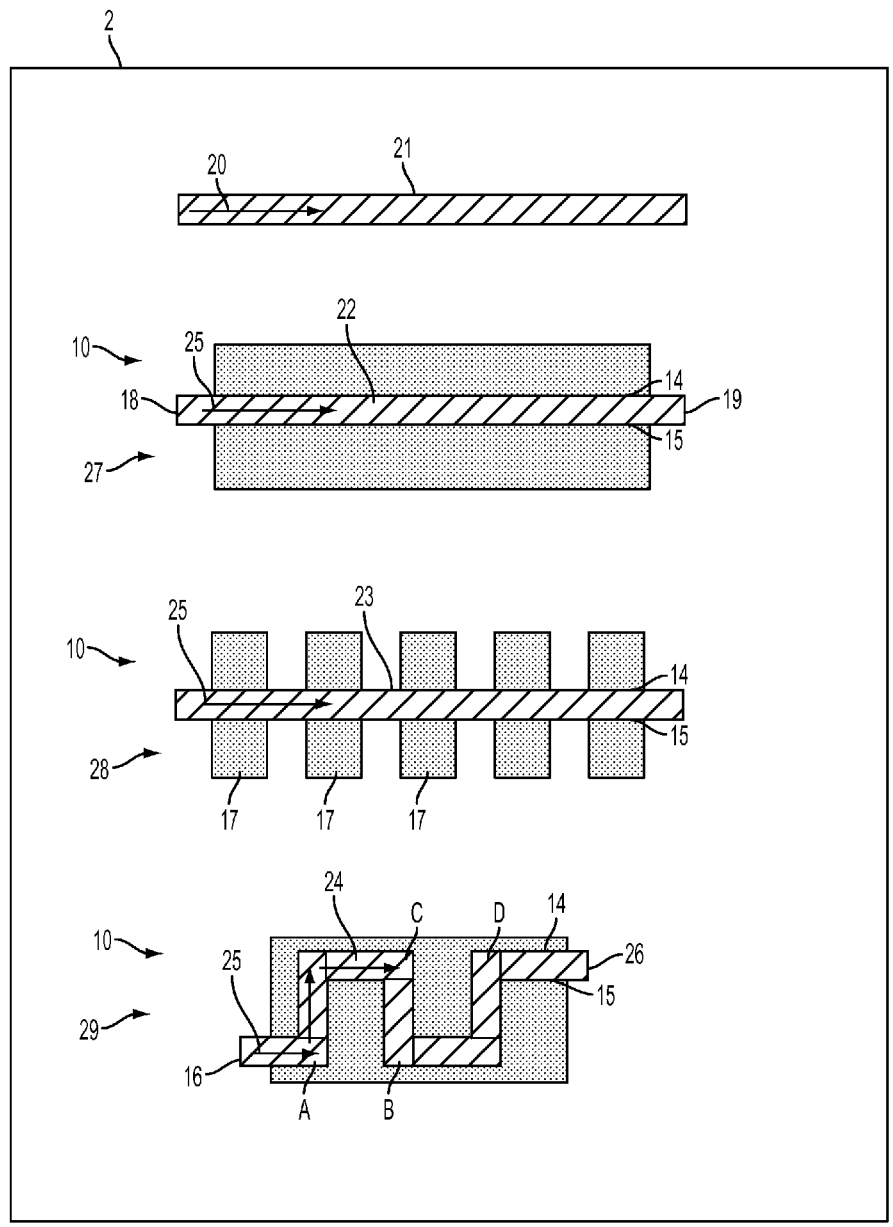
FIG. 2 depicts aspects of various embodiments of the absorptive filter.

Reference may now be had to FIG. 2, which illustrates a top-view of various embodiments of the absorptive filter 10. A first conductive pathway 21 is configured to convey a DC or low-frequency signal 20. A second conductive pathway 22, a third conductive pathway 23 and a fourth conductive pathway 24 are configured to transmit an RF signal 25. In embodiment 27 of the absorptive filter 10, the resistive material is placed in contact with the second pathway 22 so that the resistive material 9 overlaps the two side-edges 14 and 15. In this embodiment, the conductive pathway 22 and the resistive material 9 are disposed linearly from point 18 to point 19. In embodiment 28 of the absorptive filter 10, the resistive material 10 is disposed in a series of stubs or segments 17 where each segment 17 is separated from adjacent segments 17. In addition, each segment 17 overlaps the edges 14 and 15. In embodiment 29 of the absorptive filter 10, the conductive pathway 24 meanders from point 16 to point 26. The meandering creates differential nodes A, B, C and D. A higher potential (phase difference) created between corresponding nodes causes the RF radiation to dissipate in the resistive material 9 for example from node A to node B and/or from node C to node D. The term "meander" relates to a conductive pathway not following a straight path from a signal entry point to a signal exit point. In one or more embodiments, a meandering conductive pathway has square, rectangular or curved oscillations about a direction or line from the signal entry point to the signal exit point. It can be appreciated that RF radiation emitted by the RF signal 25 from conductive pathways 22, 23 and 24 will be absorbed by the corresponding absorptive filters 10 and, thus, prevent or limit interference with the DC or low-frequency signal 20 conveyed by the first conductive pathway 21. In alternative embodiments, the DC or low-frequency signal 20 may be conveyed by the conductive pathways 22, 23 or 24 and any RF signals induced on those pathways will be absorbed by the corresponding absorptive filters 10 to prevent or limit interference with the signal 20.

Figure 3:
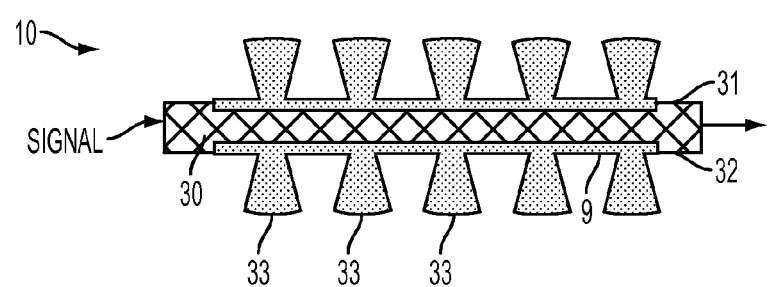
FIG. 3 depicts aspects of the absorptive filter having a plurality of stub elements of the resistive material.

Reference may now be had to FIG. 3, which illustrates a top-view of another embodiment of the absorptive filter 10. In the embodiment of FIG. 3, separate pieces of the resistive material 9 are disposed over edges 31 and 32 of a conductive pathway 30. Extending laterally from each piece of the resistive material 9 or from the pathway 30 are a plurality of resistive stub elements 33 or stubs made of the resistive material 9. The resistive stub elements 33 are periodically positioned such that each stub has a corresponding stub positioned oppositely on the other piece of the resistive material 9. In one or more embodiments, the resistive stub elements 33 are shaped as a fan as illustrated in FIG. 3, however, the resistive stub elements 33 may also have other shapes extending from the resistive material 9.

Figure 4:
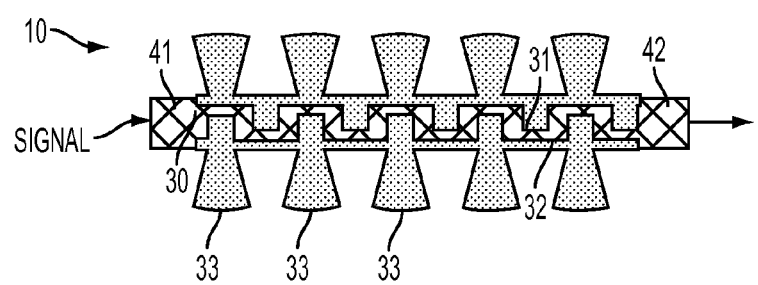
FIG. 4 depicts aspects of the absorptive filter having the plurality of stub elements of the resistive material and a meandering conductive pathway.

Reference may now be had to FIG. 4, which illustrates a top-view of yet another embodiment of the absorptive filter 10. The embodiment of FIG. 4 is similar to the embodiment of FIG. 3 with one difference being that the conductive pathway 30 meanders from the first point 41 to the second point 42. In this embodiment, the resistive material 9 is one-piece and overlaps all edges of the meandering conductive pathway 30. In an alternative embodiment, the conductive pathway 30 may be straight with a constant width and a path of the resistive material 9 may meander such that the resistive material 9 covers the edges 31 and 32 of the conductive pathway 30.

Figure 5:
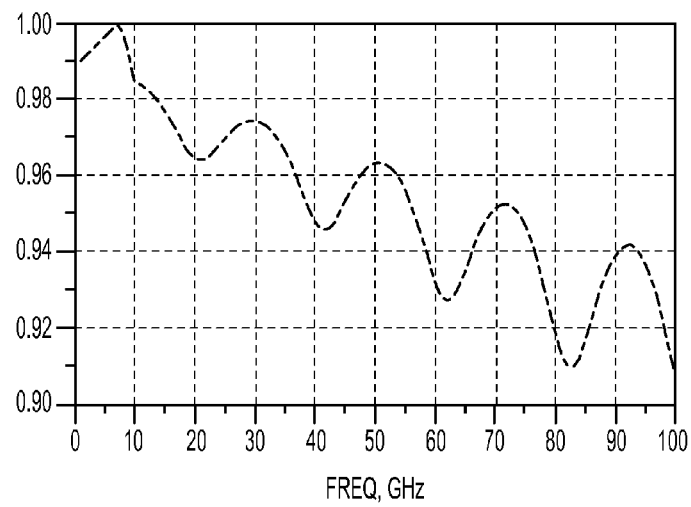
FIG. 5 is a graph depicting aspects of efficiency of absorption of a microwave signal for a conductive pathway not having the absorptive filter.
Figure 6:
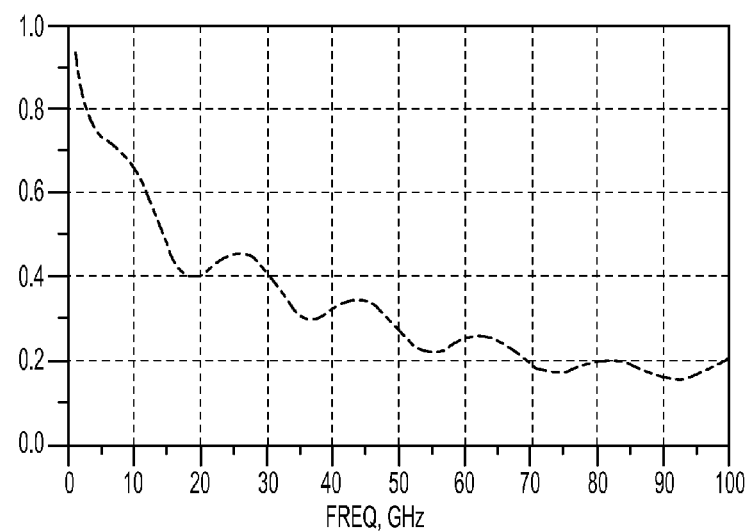
FIG. 6 is a graph depicting aspects of efficiency of absorption of a microwave signal for a conductive pathway having the absorptive filter with the plurality of resistive material stub elements.
Figure 7:
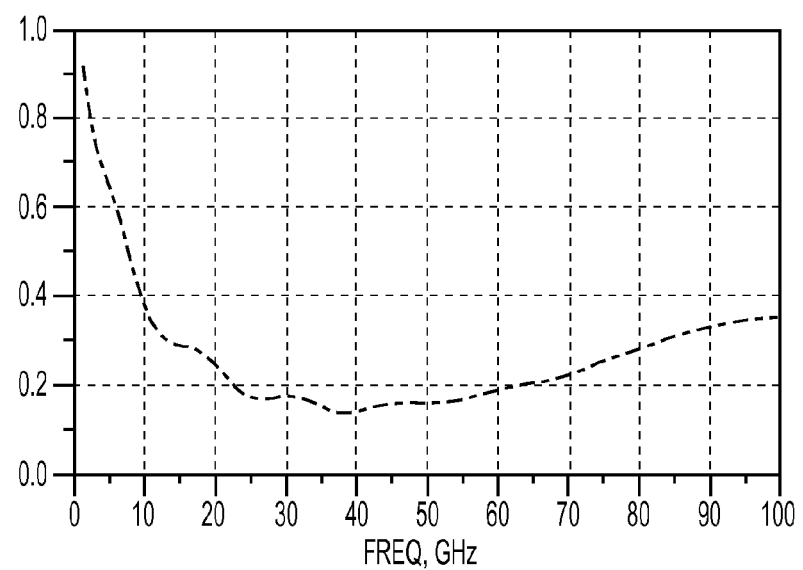
FIG. 7 is a graph depicting aspects of efficiency of absorption of a microwave signal for a conductive pathway having the absorptive filter with the plurality of resistive material stub elements and meandering of the conductive pathway.

Different embodiments of the absorptive filter 10 were analyzed to estimate the efficiency of absorption of RF radiation. As a reference, the first conductive pathway 21, not having the absorptive filter 10 and used to convey an RF signal, was analyzed and the results are presented in FIG. 5. The absorptive filter 10 in the embodiment of FIG. 3 was analyzed and the results are presented in FIG. 6. The absorptive filter 10 in the embodiment of FIG. 4 was analyzed and the results are presented in FIG. 7. FIGS. 6 and 7 show that the amount of RF radiation emitted is reduced as much as 80% or more due to the absorptive filter 10. The vertical axis in each of FIGS. 5-7 represents an efficiency of absorption of RF power that is transmitted or reflected where a value of 1 represents no loss.

Figure 8:
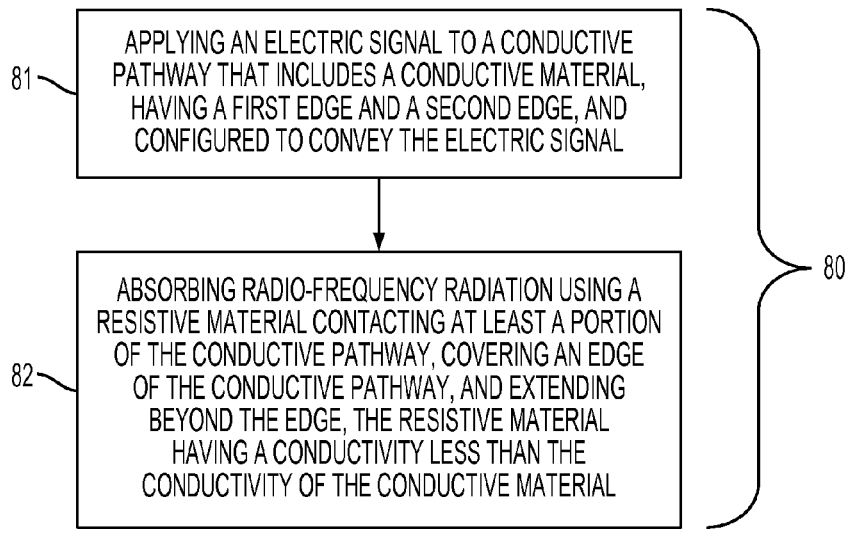
FIG. 8 is a flow chart of a method for conducting a signal in accordance with an exemplary embodiment.

FIG. 8 is a flow chart for a method 80 for conveying an electrical signal. Block 81 calls for applying the electrical signal to a conductive pathway that includes a conductive material, having a first edge and a second edge, and configured to convey the electrical signal. Block 82 calls for absorbing radio-frequency radiation using a resistive material contacting at least a portion of the conductive pathway, covering an edge of the conductive pathway, and extending beyond the edge, the resistive material having a conductivity less than the conductivity of the conductive material. The method 80 can also include using the various embodiments of the absorptive filter 10 discussed above (including the meandering of the conductive pathway) to absorb the radio-frequency radiation.

Figure 9:
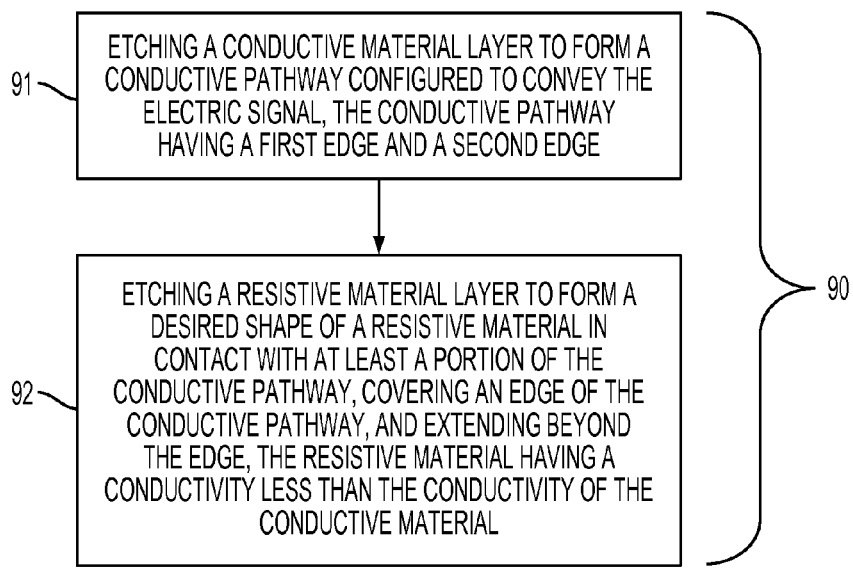
FIG. 9 is a flow chart of a method for fabricating an absorptive filter in accordance with an exemplary embodiment.

FIG. 9 is a flow chart of a method 90 for fabricating an apparatus for conveying an electrical signal. Block 91 calls for etching a conductive material layer to form a conductive pathway configured to convey the electrical signal, the conductive pathway having a first edge and a second edge. Block 92 calls for etching a resistive material layer to form a desired shape of a resistive material in contact with at least a portion of the conductive pathway, covering an edge of the conductive pathway, and extending beyond the edge, the resistive material having a conductivity less than the conductivity of the conductive material. The method 90 can also include etching the conductive material layer and the resistive material layer to fabricate the various embodiments of the absorptive filter discussed above (including the meandering of the conductive pathway).

It can be appreciated that the conductive material 7 and the resistive material 9 can be provided as "raw" or unprocessed embedded layers in the circuit board 2. As such, the conductive pathway can be etched to a desired shape (including the meandering conductive pathway) from the layer of the conductive material 7 using techniques for fabrication of semiconductor circuits and components. Similarly, elements of the absorptive filter 10 using the resistive material 9 can be etched to a desired shape (including the resistive stub elements) from the layer of resistive material 9. It can be appreciated that besides being used to fabricate the absorptive filter, the resistive material may also be etched between two conductive pads to form a resistor having a desired resistance value. It can be further appreciated that these fabrication techniques may provide a cost-effective way of producing microwave circuits on a circuit board where microwave signals may not interfere with DC or low-frequency signals also present on the circuit board.

It can be appreciated that, in one or more embodiments, a conductive pathway may convey a DC signal to an active electronic device such as a transistor in order to provide a bias to that device. The absorptive filter may be applied to the conductive pathway (including meandering of the pathway) in order to absorb and dissipate any RF radiation or energy that may interfere with the DC bias voltage and current. The absorptive filter is this case prevents erratic operation or malfunction of the active electronic device.

It can be appreciated that, in one or more embodiments, a conductive pathway and the absorptive filter can be configured to provide a quarter wave matching structure for impedance matching with a transistor or other electronic device. In this embodiment, there is no DC signal loss because the DC signal travels along the conductive pathway, which is the lowest resistive path, while RF radiation that travels along the edges of the conductive pathway is dissipated by the resistive material in the absorptive filter.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The terms "first," "second," "third," and "fourth" are used to distinguish elements and are not used to denote a particular order.

The flow charts depicted herein are just examples. There may be many variations to these charts or the steps (or operations) described therein without departing from the spirit of the invention. For instance, the steps may be performed in a differing order, or steps may be added, deleted or modified. All of these variations are considered a part of the claimed invention.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. An apparatus for conveying an electrical signal, the apparatus comprising:
    a conductive pathway comprising a conductive material, having a first edge and a second edge, and configured to convey the electrical signal; and
    a resistive material in contact with at least a portion of the conductive pathway, covering two opposing edges of the conductive pathway continuously, and extending beyond the two opposing edges, the resistive material having a conductivity less than the conductivity of the conductive material;
    wherein the resistive material comprises a plurality stubs of the resistive material extending laterally from the conductive pathway.

2. The apparatus of claim 1, wherein the conductive material or the resistive material is disposed on a dielectric substrate.

3. The apparatus according to claim 1, wherein the edge comprises a first edge at a first side of the conductive pathway and a second edge at a second side of the conductive pathway.

4. The apparatus according to claim 3, wherein the resistive material extends from beyond the first edge to beyond the second edge.

5. The apparatus according to claim 1, wherein the electrical signal comprises a microwave component.

6. The apparatus according to claim 1, wherein the resistive material comprises a series of segments with each segment separated from an adjacent segment.

7. The apparatus according to claim 1, wherein the conductive pathway is configured to convey the electrical signal from a first point to a second point and the conductive pathway meanders from the first point to the second point.

8. The apparatus according to claim 7, wherein the resistive material extends linearly from the first point to the second point.

9. The apparatus according to claim 7, further comprising a plurality of stubs of the resistive material extending laterally from the patch of resistive material.

10. An apparatus for conveying an electrical signal, the apparatus comprising:
    a conductive pathway comprising a conductive material, having a first edge and a second edge, and configured to convey the electrical signal; and
    a resistive material in contact with at least a portion of the conductive pathway, covering two opposing edges of the conductive pathway continuously, and extending beyond the two opposing edges, the resistive material having a conductivity less than the conductivity of the conductive material;
    wherein the resistive material is a resistive metal having a planar surface and a sheet resistivity value ranging from 25 to 100 ohms per square.

11. A method for conveying an electrical signal, the method comprising:
    applying the electrical signal to a conductive pathway comprising a conductive material, having a first edge and a second edge, and configured to convey the electrical signal; and
    absorbing radio-frequency radiation using a resistive material contacting at least a portion of the conductive pathway, covering two opposing edges of the conductive pathway continuously, and extending beyond the two opposing edges, the resistive material having a conductivity less than the conductivity of the conductive material
    wherein the resistive material comprises a plurality stubs of the resistive material extending laterally from the conductive pathway.

12. The method according to claim 11, wherein the resistive material comprises a series of segments with each segment separated from an adjacent segment.

13. The method according to claim 11, wherein the conductive pathway is configured to convey the electrical signal from a first point to a second point and the conductive pathway meanders from the first point to the second point.

14. The method according to claim 13, wherein the resistive material extends linearly from the first point to the second point.

15. The method according to claim 14, wherein the resistive material comprises a plurality of stubs extending laterally from the patch of resistive material.

16. A method for fabricating an apparatus for conveying an electrical signal, the method comprising:
- etching a conductive material layer to form a conductive pathway configured to convey the electrical signal, the conductive pathway having a first edge and a second edge; and
- etching a resistive material layer to form a desired shape of a resistive material contacting at least a portion of the conductive pathway, covering two opposing edges of the conductive pathway continuously, and extending beyond the two opposing edges, the resistive material having a conductivity less than the conductivity of the conductive material
- wherein the desired shape comprises a plurality stubs of the resistive material extending laterally from the conductive pathway.

17. The method according to claim 16, wherein the conductive pathway is configured to convey the electrical signal from a first point to a second point and the conductive pathway meanders from the first point to the second point.

* * * * *